United States Patent [19]
Kohyama

[11] Patent Number: 5,482,869
[45] Date of Patent: Jan. 9, 1996

[54] GETTERING OF UNWANTED METAL IMPURITY INTRODUCED INTO SEMICONDUCTOR SUBSTRATE DURING TRENCH FORMATION

[75] Inventor: Yusuke Kohyama, Yokosuka, Japan

[73] Assignee: Kabushiki Kaisha Toshiba, Kanagawa, Japan

[21] Appl. No.: 203,943

[22] Filed: Mar. 1, 1994

[30] Foreign Application Priority Data

Mar. 1, 1993 [JP] Japan .................... 5-039947

[51] Int. Cl.$^6$ .................................... H01L 21/306
[52] U.S. Cl. ................. 437/12; 437/67; 437/60; 437/919
[58] Field of Search .................. 437/12, 67, 919, 437/162; 148/DIG. 60

[56] References Cited

U.S. PATENT DOCUMENTS

| | | | |
|---|---|---|---|
| 4,621,414 | 11/1986 | Iranmanesh | 437/12 |
| 4,676,897 | 6/1987 | Lin | 437/67 |
| 4,728,623 | 3/1988 | Lu et al. | 437/52 |
| 4,897,154 | 1/1990 | Chakravarti et al. | 148/DIG. 60 |
| 5,098,852 | 3/1992 | Niki et al. | 437/12 |
| 5,106,774 | 4/1992 | Hieda et al. | 437/162 |
| 5,244,819 | 9/1993 | Yue | 437/12 |
| 5,244,835 | 9/1993 | Hachiya | 437/186 |
| 5,360,748 | 11/1994 | Nadahara et al. | 437/12 |

FOREIGN PATENT DOCUMENTS

| | | | |
|---|---|---|---|
| 58-138035 | 8/1983 | Japan | 437/12 |
| 62-208638 | 9/1987 | Japan | 437/12 |
| 2-12920 | 1/1990 | Japan | 437/12 |

OTHER PUBLICATIONS

*IEEE Transactions on Electron Devices*, vol. 35, No. 8, Aug. 1988, pp. 1257–1263; "Half–$V_{cc}$ Sheath–Plate Capacitor DRAM Cell with Self–Aligned Buried Plate Wiring".

*Primary Examiner*—Olik Chaudhuri
*Assistant Examiner*—S. Mulpuri
*Attorney, Agent, or Firm*—Banner & Allegretti, Ltd.

[57] ABSTRACT

After a trench is formed in a semiconductor substrate, a semiconductor film is formed on the inner wall of the trench. Annealing is performed in a predetermined condition to subject an unwanted metal impurity to gettering into the semiconductor film. The semiconductor film is then oxidized.

11 Claims, 2 Drawing Sheets

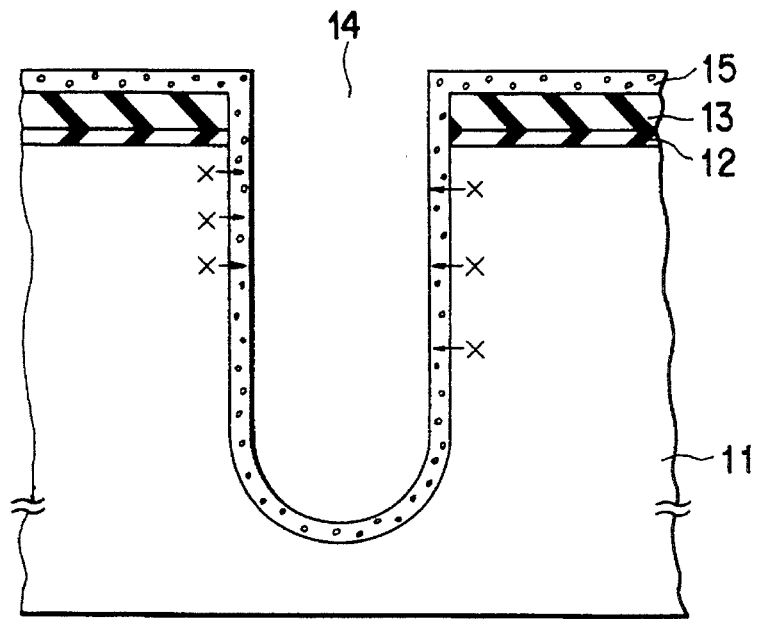
F I G. 1
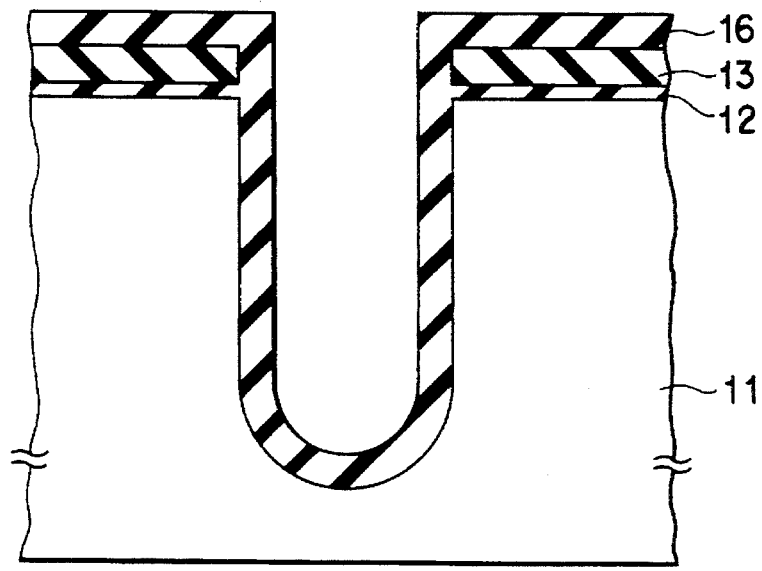
F I G. 2

GETTERING OF UNWANTED METAL IMPURITY INTRODUCED INTO SEMICONDUCTOR SUBSTRATE DURING TRENCH FORMATION

BACKGROUND OF THE INVENTION

1. Field of the Invention

The present invention relates to a method of making of a semiconductor device and, more particularly, to gettering of a metal impurity.

2. Description of the Related Art

Conventionally, the memory cell of a DRAM is constituted by a transistor and a capacitor. The capacitor of the memory cell is formed in a trench formed in a substrate (as the memory cell of a DRAM, see Transactions on Electron Devices, Vol. 35, No. 8, August 1988, pp. 1257–1263).

A conventional method of making a semiconductor device will be briefly described.

As shown in FIG. 3, a silicon oxide film 2 and a silicon nitride film 3 are formed on a semiconductor substrate 1. After patterning the silicon oxide film 2 and the silicon nitride film 3, the silicon nitride film 3 is used as a mask to form a trench 4 in the substrate 1 by using, for example, an anisotropic etching method (to be referred to as an RIE method hereinafter). According to this etching method, the substrate 1 is etched, and at the same time, the electrode (consists of a metal) of the etching apparatus is sputtered. For this reason, a very small amount of metal impurity is contained in the etching gas. These metal impurity are introduced into the substrate 1 (in more detail, in the side wall portion of the trench 4 formed in the substrate 1; indicated by x in FIG. 3). A silicon oxide film 5 is then formed on the inner wall and the bottom surface of the trench 4.

As shown in FIG. 4, the silicon oxide film 5 is etched and removed by the RIE method only at the bottom portion of the trench 4. A polysilicon film 21 is then deposited on the bottom and the side wall portions of the trench 4. By using, for example, a phosphorus diffusion method, the polysilicon film 21 is doped to form an n-type film, and at the same time, an n-type diffusion layer 22 is formed on the bottom portion of the trench 4. The polysilicon film 21 is formed into a sheath-like shape, and a composite film 23 consisting of $SiO_2$/SiN is then formed in the trench 4. The trench 4 is filled with an n-type polysilicon film 6. As a result, a sheath type capacitor constituted by the polysilicon film 6, the composite film 23, and the polysilicon film 21 is formed.

The surface of the polysilicon film 6 is oxidized to form a silicon oxide film 7. A MOSFET 8 of a memory cell is formed in the active region, and at the same time, the electrode (polysilicon film 6) of the capacitor is electrically connected to the source/drain region of the MOSFET 8 by using an appropriate method. The gate electrode of the MOSFET is connected to a word line, and a bit line and a metal wiring are formed, thereby completing a DRAM.

As described above, the trench 4 is formed in the substrate 1 by the RIE method. In this case, the electrode of the etching apparatus is sputtered. For this reason, a very small amount of metal impurity is contained in the etching gas, resulting in doping of the metal impurity in the substrate 1.

Therefore, as shown in FIG. 4, in the diffusion layer formed near the side wall of the trench, i.e., in the junction surface of the source/drain region of the MOSFET constituting the memory cell of the DRAM, a leakage current occurs to degrade reliability of the element.

SUMMARY OF THE INVENTION

It is an object of the present invention to provide a method of making a semiconductor device, in which an unwanted metal impurity introduced into a semiconductor substrate during a trench formation is subjected to gettering.

According to one aspect of the present invention, there is provided a method of making a semiconductor device, which includes: preparing a semiconductor substrate of a first conductivity type, forming a trench in the semiconductor substrate, forming a semiconductor layer over an inner wall of the trench, annealing the semiconductor substrate to subject an unwanted metal impurity, contained in the semiconductor substrate, to gettering, and oxidizing the semiconductor layer to form an insulating layer.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 1 is the first sectional view showing a method of making a semiconductor device according to an embodiment of the present invention;

FIG. 2 is the second sectional view showing the method of making a semiconductor device according to an embodiment of the present invention;

DETAILED DESCRIPTION OF THE PREFERRED EMBODIMENTS

Figure 3:
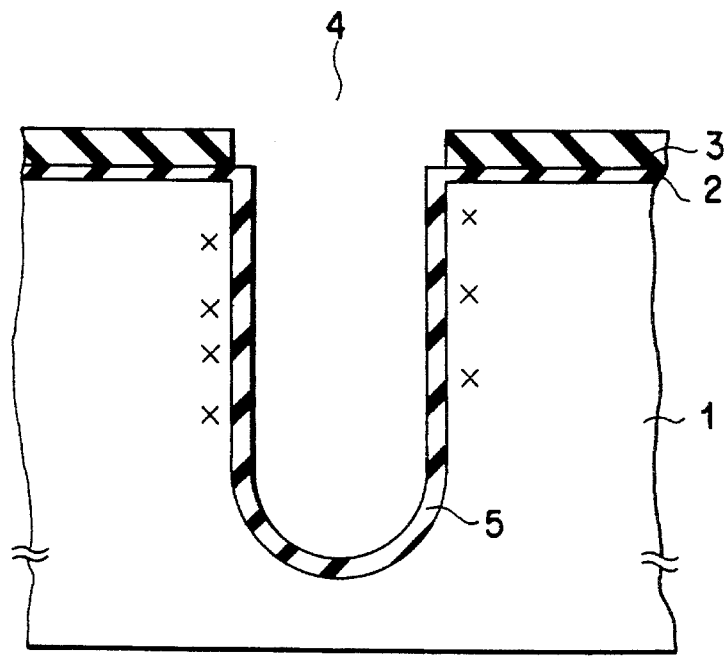
FIG. 3 is the first sectional view showing a conventional method of making a semiconductor device.

An embodiment of the present invention will be described below in detail with reference to FIGS. 1 and 2.

As shown in FIG. 1, a silicon oxide film 12 and a silicon nitride film 13 are formed on a semiconductor substrate 11. The silicon oxide film 12 and the silicon nitride film 13 are patterned. The silicon nitride film 13 is then used as a mask to form a trench 14 in the substrate 11 by using, for example, an RIE method. At this time, a metal impurity (indicated by x in FIG. 1) generated during etching is introduced into the substrate 11.

A semiconductor film (for example, a boron doped polysilicon film) 15 is formed on the inner wall and the bottom surface of the trench 14. It is preferable that the semiconductor film 15 has the same conductivity type as that of the substrate 11. When annealing is performed at about 600° C. for about 30 minutes, the metal impurity introduced in the substrate 11 is subjected to gettering into the semiconductor film 15.

As shown in FIG. 2, wet oxidation is performed in an atmosphere with about 10% HCl (hydrochloric acid) to oxidize the semiconductor film 15 to form an oxide film 16. At this time, the metal impurity gettered into the semiconductor film 15 is absorbed in the oxide film 16.

Figure 4:
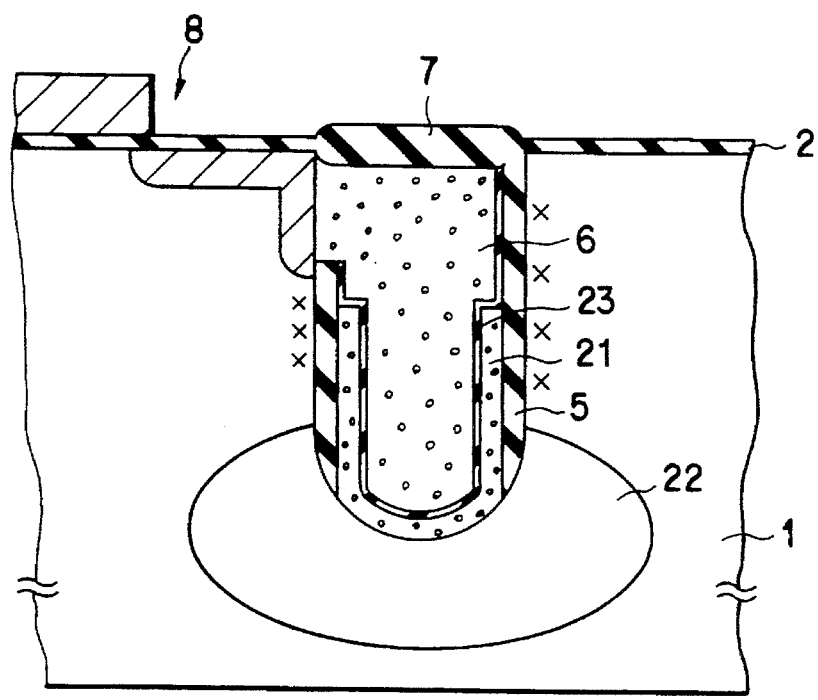
FIG. 4 is the second sectional view showing the conventional method of making a semiconductor device.

A so-called sheath type capacitor (not shown; see, for example, FIG. 4) is formed in the trench 14. A MOSFET of a memory cell is formed in the active region. The electrode of the capacitor is electrically connected to the source or drain region of the MOSFET by using an appropriate method. The gate electrode of the MOSFET is connected to a word line, and a bit line and a metal wiring are formed, thereby completing a DRAM.

According to the above method, even when the trench 14 is formed in the substrate 11 by the RIE method, the unwanted metal impurity introduced the substrate 11 is subjected to gettering in the semiconductor film 15. Since no metal impurity is present in the side wall of the trench 14, a leakage current does not easily flow in the junction surface of the source/drain region of the MOSFET, providing a DRAM with high reliability. In the above embodiment, the oxide film 16 on the trench 14 may be temporarily removed, and an oxide film may be newly formed. In addition, the present invention can be applied to not only the trench capacitor of a DRAM but also a semiconductor device having a p-n junction near the side wall of the trench according to a trench isolation technique.

It is further understood by those skilled in the art that the foregoing description is only of the preferred embodiments and that various changes and modifications may be made in the invention without departing from the spirit and scope thereof.

What is claimed is:

1. A method of making a semiconductor device comprising the steps of:
   forming a trench in a first conductivity-type semiconductor substrate;
   lining an inner wall of said trench with a semiconductor layer;
   annealing said semiconductor substrate to subject an unwanted metal impurity contained in said semiconductor substrate to gettering into said semiconductor layer;
   oxidizing entirely said semiconductor layer to form an insulating layer;
   forming a capacitor in said trench; and
   connecting an electrode of said capacitor to a source/drain region of a MOSFET.

2. The method according to claim 1, wherein said insulating layer is removed from the inner wall of said trench and another insulating layer is newly formed to line the inner wall of said trench.

3. The method according to claim 1, wherein said step of forming said trench comprises reactive ion etching, thereby introducing said unwanted metal impurity into said semiconductor substrate.

4. The method according to claim 1, wherein said semiconductor layer has the same conductivity type as that of said semiconductor substrate.

5. The method according to claim 1, wherein said semiconductor layer comprises a polysilicon layer.

6. The method according to claim 1, wherein said step of forming said capacitor in said trench comprises:
   forming an opening in said insulating film at the bottom of said trench;
   forming a first polysilicon layer on said insulating layer partly exposed to said semiconductor substrate through the opening at the bottom of said trench;
   forming a capacitor dielectric layer on said first polysilicon layer; and
   forming a second polysilicon layer on said capacitor dielectric layer.

7. A method of making a semiconductor device comprising the steps of:
   forming a trench in a first conductivity-type semiconductor substrate;
   forming a semiconductor layer within said trench, wherein a first semiconductor layer portion having a first outer surface covers a first inner surface of said trench and a second semiconductor layer portion having a second outer surface covers a second inner surface of said trench, said first outer surface being spaced from and opposing said second outer surface;
   annealing said semiconductor substrate to subject an unwanted metal impurity contained in said semiconductor substrate to gettering into said semiconductor layer
   oxidizing entirely said semiconductor layer to form an insulating layer;
   forming a capacitor in said trench; and
   connecting an electrode of said capacitor to a source/drain region of a MOSFET.

8. The method according to claim 7, wherein said semiconductor layer comprises a polysilicon layer.

9. The method according to claim 8, wherein said step of forming said trench comprises reactive ion etching.

10. The method according to claim 9, further comprising the step of removing said oxidized semiconductor layer.

11. The method according to claim 10, wherein said step of forming a capacitor comprises the step of forming an oxide film to line said trench after said step of removing said oxidized polysilicon layer.

\* \* \* \* \*